United States Patent
Sasaki et al.

(10) Patent No.: US 10,943,809 B2
(45) Date of Patent: Mar. 9, 2021

(54) ELECTROSTATIC CHUCK INCLUDING CERAMIC DIELECTRIC SUBSTRATE

(71) Applicant: TOTO LTD., Kitakyushu (JP)

(72) Inventors: Hitoshi Sasaki, Kitakyushu (JP); Yutaka Momiyama, Kitakyushu (JP)

(73) Assignee: Toto Ltd., Fukuoka (JP)

( * ) Notice: Subject to any disclaimer, the term of this patent is extended or adjusted under 35 U.S.C. 154(b) by 0 days.

(21) Appl. No.: 16/825,318

(22) Filed: Mar. 20, 2020

(65) Prior Publication Data

US 2020/0303232 A1 Sep. 24, 2020

(30) Foreign Application Priority Data

Mar. 22, 2019 (JP) .............................. JP2019-054723
Dec. 11, 2019 (JP) .............................. JP2019-223575

(51) Int. Cl.
| | |
|---|---|
| H01L 21/683 | (2006.01) |
| B23Q 3/15 | (2006.01) |
| H01J 37/32 | (2006.01) |
| C23C 16/458 | (2006.01) |
| H01L 21/3065 | (2006.01) |
| H01L 21/67 | (2006.01) |
| H01L 21/687 | (2006.01) |

(52) U.S. Cl.
CPC ............ *H01L 21/6833* (2013.01); *B23Q 3/15* (2013.01); *C23C 16/4586* (2013.01);
(Continued)

(58) Field of Classification Search
CPC .................. B23Q 3/15; C23C 16/4586; H01J 2237/2001; H01J 2237/2007; H01J 2237/3344; H01J 37/32082; H01J 37/32642; H01J 37/32697; H01J 37/32715; H01J 37/32724; H01J 37/32908; H01L 21/3065; H01L 21/67069; H01L 21/67098;
(Continued)

(56) References Cited

U.S. PATENT DOCUMENTS 5,530,616 A * 6/1996 Kitabayashi ........ H01L 21/6831
361/234
6,478,924 B1 * 11/2002 Shamouilian ..... H01J 37/32706
(Continued)

FOREIGN PATENT DOCUMENTS

| JP | 2003-152057 A | 5/2003 |
|---|---|---|
| JP | 2005-197391 A | 7/2005 |

(Continued)

*Primary Examiner* — Jared Fureman
*Assistant Examiner* — Nicolas Bellido
(74) *Attorney, Agent, or Firm* — Carrier Blackman & Associates, P.C.; Joseph P. Carrier; Anne G. Sabourin

(57) ABSTRACT

According to one embodiment, an electrostatic chuck includes a ceramic dielectric substrate, a base plate, and a first electrode layer. The ceramic dielectric substrate has first and second major surfaces. The first electrode layer is provided inside the ceramic dielectric substrate. The first electrode layer is connected to a high frequency power supply. The first electrode layer has a first surface at the first major surface side and a second surface at a side opposite to the first surface. The first electrode layer includes a first portion including the first surface. The first electrode layer includes a ceramic component and a metal component. A concentration of the metal component in the first portion is higher than an average concentration of the metal component in the first electrode layer.

14 Claims, 4 Drawing Sheets

(52) U.S. Cl.
CPC .... *H01J 37/32715* (2013.01); *H01L 21/3065* (2013.01); *H01L 21/67098* (2013.01); *H01L 21/68757* (2013.01)

(58) Field of Classification Search
CPC ......... H01L 21/67109; H01L 21/67248; H01L 21/67288; H01L 21/6831; H01L 21/6833; H01L 21/687; H01L 21/68757; H02N 13/00
USPC .................................................. 361/230, 234
See application file for complete search history.

(56) References Cited

U.S. PATENT DOCUMENTS

| | | | |
|---|---|---|---|
| 6,483,690 B1 * | 11/2002 | Nakajima | ........... H01L 21/6833 361/234 |
| 10,840,119 B2 * | 11/2020 | Sasaki | ...................... B23Q 3/15 |
| 2003/0085206 A1 | 5/2003 | Kosakai | |
| 2009/0199967 A1 | 8/2009 | Himori et al. | |
| 2010/0002354 A1 | 1/2010 | Inazumachi et al. | |
| 2010/0300622 A1 | 12/2010 | Yatsuda et al. | |
| 2011/0096461 A1 | 4/2011 | Yoshikawa et al. | |
| 2016/0314981 A1 * | 10/2016 | Yoon | .................. H01L 21/32139 |
| 2018/0122680 A1 * | 5/2018 | Yang | ................. H01L 21/67288 |

FOREIGN PATENT DOCUMENTS

| | | | |
|---|---|---|---|
| JP | 2006-062898 A | 3/2006 |
| JP | 2008-042141 A | 2/2008 |
| JP | 2008-277847 A | 11/2008 |
| JP | 2009-188342 A | 8/2009 |
| JP | 2010-161109 A | 7/2010 |
| JP | 2010-278166 A | 12/2010 |
| JP | 2011-119654 A | 6/2011 |

* cited by examiner

ELECTROSTATIC CHUCK INCLUDING CERAMIC DIELECTRIC SUBSTRATE

CROSS-REFERENCE TO RELATED APPLICATIONS

This application is based upon and claims the benefit of priority from Japanese Patent Application No. 2019-54723, filed on Mar. 22, 2019, and No. 2019-223575, filed on Dec. 11, 2019; the entire contents of which are incorporated herein by reference.

FIELD

Embodiments described herein relate generally to an electrostatic chuck.

BACKGROUND

An electrostatic chuck is used to attract and hold a processing object such as a semiconductor wafer, a glass substrate, etc., inside a plasma processing chamber that performs etching, CVD (Chemical Vapor Deposition), sputtering, ion implantation, ashing, etc. The electrostatic chuck applies electrical power for electrostatic attraction to a built-in electrode and chucks a substrate such as a silicon wafer, etc., by an electrostatic force.

When performing plasma processing, for example, plasma is generated by applying a voltage from an RF (Radio Frequency) power supply (a high frequency power supply) to an upper electrode provided at an upper portion inside a chamber and to a lower electrode provided lower than the upper electrode.

In a conventional electrostatic chuck, the plasma is generated using, as the lower electrode, a base plate provided in a lower portion of the electrostatic chuck. However, the plasma control is limited in such a configuration under conditions where it is desirable to perform better control of the wafer in-plane distribution of the plasma density by selecting the appropriate frequency. Therefore, in recent years, it is being attempted to increase the plasma controllability by providing a lower electrode for plasma generation built into a dielectric layer provided on a base plate. Also, it is desirable to increase the in-plane uniformity of the plasma density.

SUMMARY

According to the embodiment, an electrostatic chuck includes a ceramic dielectric substrate, a base plate, and at least one first electrode layer. The ceramic dielectric substrate has a first major surface and a second major surface. The first major surface is where an object to be chucked is placed. The second major surface is at a side opposite to the first major surface. The base plate supports the ceramic dielectric substrate. The first electrode layer is provided inside the ceramic dielectric substrate. The first electrode layer is connected to a high frequency power supply. The first electrode layer is provided between the first major surface and the second major surface in a Z-axis direction. The Z-axis direction is from the base plate toward the ceramic dielectric substrate. The first electrode layer has a first surface and a second surface. The first electrode layer is supplied with power at the second surface side. The first surface is at the first major surface side. The second surface is at a side opposite to the first surface. The first electrode layer includes a first portion. The first portion includes the first surface. The first electrode layer includes a ceramic component and a metal component. A concentration of the metal component in the first portion is higher than an average concentration of the metal component in the first electrode layer.

DETAILED DESCRIPTION

Figure 1:
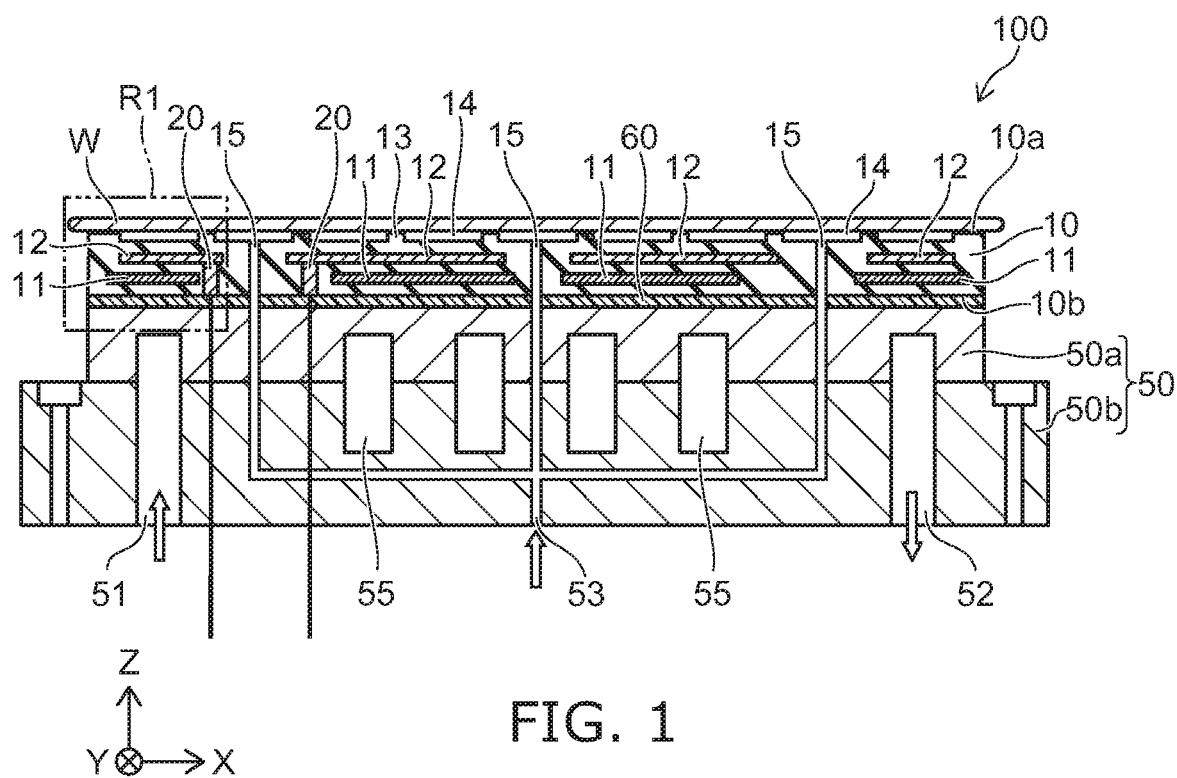
FIG. 1 is a schematic cross-sectional view illustrating an electrostatic chuck according to an embodiment.

A first invention is an electrostatic chuck including a ceramic dielectric substrate, a base plate, and at least one first electrode layer; the ceramic dielectric substrate has a first major surface where an object to be chucked is placed, and a second major surface at a side opposite to the first major surface; the base plate supports the ceramic dielectric substrate; the at least one first electrode layer is provided inside the ceramic dielectric substrate and connected to a high frequency power supply; the first electrode layer is provided between the first major surface and the second major surface in a Z-axis direction; the Z-axis direction is from the base plate toward the ceramic dielectric substrate; the first electrode layer has a first surface at the first major surface side, has a second surface at a side opposite to the first surface, and is supplied with power at the second surface side; the first electrode layer includes a first portion and includes a ceramic component and a metal component; the first portion includes the first surface; and a concentration of the metal component in the first portion is higher than an average concentration of the metal component in the first electrode layer.

According to the electrostatic chuck, by providing the first electrode layer connected to the high frequency power supply inside the ceramic dielectric substrate, for example, the distance between the first electrode layer (the lower electrode) and the upper electrode for plasma generation provided higher than the electrostatic chuck can be shortened. Thereby, for example, compared to when the base plate is used as the lower electrode for plasma generation, etc., the plasma density can be increased using low electrical power. The responsiveness of the plasma control can be increased. Also, although the high frequency current propagates along the surface of the first electrode layer due to the skin effect, if the skin effect of the first surface of the first portion is weak, the high frequency current that is supplied to the second surface which is the surface of the first electrode layer on the second major surface side cannot flow to the center of the first surface which is the surface of the first electrode layer on the first major surface side; and there are cases where the plasma density at the center vicinity of the first electrode layer is not as expected. According to the electrostatic chuck, by setting the concentration of the metal component in the first portion to be higher than the average concentration of the metal component in the first electrode layer, the electrical resistance of the first surface of the first portion can be smaller than the average electrical resistance of the first electrode layer. Thereby, the skin effect of the first surface can be promoted; and the high frequency current that is supplied to the second surface of the first electrode layer can flow to the center of the first surface. Accordingly, the plasma controllability can be increased; and the in-plane uniformity of the plasma density in the first electrode layer can be increased.

A second invention is the electrostatic chuck of the first invention, further including at least one second electrode layer provided inside the ceramic dielectric substrate and connected to a chucking power supply; a dimension in the Z-axis direction of the first electrode layer is larger than a dimension in the Z-axis direction of the second electrode layer; and the second electrode layer is provided between the first electrode layer and the first major surface in the Z-axis direction.

Thus, according to the electrostatic chuck according to the embodiment, the second electrode layer which is the chucking electrode for chucking the object can be provided separately from the first electrode layer which is the lower electrode for generating the plasma. Also, by setting the dimension in the Z-axis direction of the first electrode layer to be larger than the dimension in the Z-axis direction of the second electrode layer, the effects of the skin effect can be reduced; and the in-plane uniformity of the plasma density can be increased further.

A third invention is the electrostatic chuck of the second invention, wherein the concentration of the metal component in the first portion is higher than an average concentration of the metal component in the second electrode layer.

According to the electrostatic chuck, because the metal component concentration of the first portion of the first electrode layer is higher than the average concentration of the metal component in the second electrode layer, the resistance of the first electrode layer to which the high frequency power is supplied can be reduced sufficiently.

A fourth invention is the electrostatic chuck of the second or third invention, wherein the first electrode layer further includes a third portion including the second surface, and a concentration of the metal component in the third portion is higher than an average concentration of the metal component in the second electrode layer.

According to the electrostatic chuck, because the metal component concentration of the third portion of the first electrode layer is higher than the average concentration of the metal component in the second electrode layer, the resistance of the first electrode layer to which the high frequency power is supplied can be reduced sufficiently.

A fifth invention is an electrostatic chuck of any one of the first to fourth inventions, wherein the concentration of the metal component in the first portion is higher than a concentration of the metal component in a portion of the first electrode layer other than the first portion.

According to the electrostatic chuck, by setting the concentration of the metal component in the first portion to be higher than the concentration of the metal component in the portion of the first electrode layer other than the first portion, the electrical resistance of the first surface of the first portion can be smaller than the electrical resistance of the portion of the first electrode layer other than the first portion. Thereby, the skin effect of the first surface can be promoted; and the high frequency current that is supplied to the second surface of the first electrode layer can flow to the center of the first surface. Accordingly, the plasma controllability can be increased; and the in-plane uniformity of the plasma density in the first electrode layer can be increased.

A sixth invention is the electrostatic chuck of any one of the first to fifth inventions, wherein the first electrode layer further includes a second portion adjacent to the first portion in the Z-axis direction, and the concentration of the metal component in the first portion is higher than a concentration of the metal component in the second portion.

According to the electrostatic chuck, by setting the concentration of the metal component in the first portion to be higher than the concentration of the metal component in the second portion, the electrical resistance of the first surface of the first portion can be smaller than the electrical resistance of the second portion. Thereby, the skin effect of the first surface can be promoted; and the high frequency current that is supplied to the second surface of the first electrode layer can flow to the center of the first surface. Accordingly, the plasma controllability can be increased; and the in-plane uniformity of the plasma density in the first electrode layer can be increased.

A seventh invention is the electrostatic chuck of any one of the first to sixth inventions, wherein the first electrode layer further includes a third portion including the second surface, and a concentration of the metal component in the third portion is higher than the average concentration of the metal component in the first electrode layer.

According to the electrostatic chuck, by setting the concentration of the metal component in the third portion to be higher than the average concentration of the metal component in the first electrode layer, the surfaces of both the second surface side and the first surface side of the first electrode layer where the high frequency power is supplied and a high frequency current is considered to flow due to the skin effect can have a low resistance. The plasma controllability can be improved thereby.

An eighth invention is the electrostatic chuck of the seventh invention, wherein a thermal conductivity of the metal component is larger than a thermal conductivity of the ceramic component.

According to the electrostatic chuck, by setting the thermal conductivity of the metal component included in the first electrode layer to be larger than the thermal conductivity of the ceramic component included in the first electrode layer and setting the concentration of the metal component in the third portion positioned at the base plate side to be higher than the average concentration of the metal component in the first electrode layer, the heat that is generated when the high frequency power is applied can be dissipated efficiently to the base plate side; and the unfavorable effects on the in-plane uniformity of the plasma density due to the heat generation can be suppressed.

A ninth invention is the electrostatic chuck of any one of the first to eighth inventions, wherein the first electrode layer further includes a third portion and a fourth portion; the third portion includes the second surface; the fourth portion is adjacent to the third portion in the Z-axis direction; and a concentration of the metal component in the third portion is higher than a concentration of the metal component in the fourth portion.

According to the electrostatic chuck, by setting the concentration of the metal component in the third portion to be higher than the concentration of the metal component in the fourth portion, the surfaces of both the second surface side and the first surface side of the first electrode layer where the high frequency power is supplied and a high frequency current is considered to flow due to the skin effect can have a low resistance. The plasma controllability can be improved thereby.

A tenth invention is the electrostatic chuck of any one of the first to ninth inventions, wherein the concentration of the metal component in the first portion is 30% or more.

According to the electrostatic chuck, by setting the concentration of the metal component in the first portion to be 30% or more, the resistance value of the first portion can be a value more favorable as the lower electrode for plasma generation.

An eleventh invention is the electrostatic chuck of any one of the first to tenth inventions, wherein the ceramic component is the same as a major component of the ceramic dielectric substrate.

According to the electrostatic chuck, by setting the ceramic component of the first electrode layer to be the same as a major component of the ceramic dielectric substrate, the difference between the thermal expansion coefficient of the ceramic dielectric substrate and the thermal expansion coefficient of the first electrode layer can be reduced; and discrepancies such as peeling between the ceramic dielectric substrate and the first electrode layer, etc., can be suppressed.

A twelfth invention is the electrostatic chuck of any one of the first to eleventh inventions, wherein the ceramic component includes at least one of aluminum oxide, aluminum nitride, silicon carbide, silicon nitride, or yttrium oxide.

Thus, according to the electrostatic chuck according to the embodiment, for example, by using the first electrode layer including the ceramic component of at least one of aluminum oxide, aluminum nitride, silicon carbide, silicon nitride, or yttrium oxide, an electrostatic chuck can be provided that has various excellent characteristics such as plasma resistance, mechanical strength, thermal conductivity, electrical insulative properties, etc.

A thirteenth invention is the electrostatic chuck of any one of the first to twelfth inventions, wherein the metal component includes at least one of palladium, silver, platinum, molybdenum, or tungsten.

Thus, according to the electrostatic chuck according to the embodiment, for example, the first electrode layer that includes the metal component of at least one of palladium, silver, platinum, molybdenum, or tungsten can be used.

A fourteenth invention is the electrostatic chuck of any one of the first to thirteenth inventions, wherein a thickness of the first electrode layer is not less than 1 μm and not more than 500 μm.

According to the electrostatic chuck, by setting the thickness of the first electrode layer to be in this range, the effects of the skin effect can be reduced; the in-plane uniformity of the plasma density can be increased; and the decrease of the RF responsiveness can be suppressed.

Embodiments of the invention will now be described with reference to the drawings. Similar components in the drawings are marked with the same reference numerals; and a detailed description is omitted as appropriate.

FIG. 1 is a schematic cross-sectional view illustrating an electrostatic chuck according to an embodiment.

As illustrated in FIG. 1, the electrostatic chuck 100 includes a ceramic dielectric substrate 10, a first electrode layer 11, a second electrode layer 12, and a base plate 50.

The ceramic dielectric substrate 10 is, for example, a base material having a flat plate configuration made of a sintered ceramic. For example, the ceramic dielectric substrate 10 includes aluminum oxide (alumina ($Al_2O_3$)). For example, the ceramic dielectric substrate 10 is formed of high-purity aluminum oxide. The concentration of aluminum oxide in the ceramic dielectric substrate 10 is, for example, not less than 90 mass percent (mass %) and not more than 100 mass %, and favorably not less than 95 mass percent (mass %) and not more than 100 mass %, and more favorably not less than 99 mass percent (mass %) and not more than 100 mass %. By using high-purity aluminum oxide, the plasma resistance of the ceramic dielectric substrate 10 can be improved. The concentration of aluminum oxide can be measured by fluorescent X-ray analysis, etc.

The ceramic dielectric substrate 10 may include at least one of aluminum nitride, silicon carbide, silicon nitride, or yttrium oxide (yttria ($Y_2O_3$)). By using the ceramic dielectric substrate 10 including these ceramics, an electrostatic chuck can be provided that has various excellent characteristics such as plasma resistance, mechanical strength, thermal conductivity, electrical insulative properties, etc.

The ceramic dielectric substrate 10 has a first major surface 10a and a second major surface 10b. The first major surface 10a is a surface where an object W to be chucked is placed. The second major surface 10b is a surface on the side opposite to the first major surface 10a. The object W to be chucked is, for example, a semiconductor substrate such as a silicon wafer, etc.

In this specification, the direction from the base plate 50 toward the ceramic dielectric substrate 10 is taken as a Z-axis direction. For example, as illustrated in the drawings, the Z-axis direction is the direction connecting the first major surface 10a and the second major surface 10b. The Z-axis direction is, for example, a direction substantially perpendicular to the first major surface 10a and the second major surface 10b. One direction orthogonal to the Z-axis direction is taken as an X-axis direction; and a direction orthogonal to the Z-axis direction and the X-axis direction is taken as a Y-axis direction. In this specification, "in the plane" is, for example, in the X-Y plane.

The first electrode layer 11 and the second electrode layer 12 are provided inside the ceramic dielectric substrate 10. The first electrode layer 11 and the second electrode layer 12 are provided between the first major surface 10a and the second major surface 10b. In other words, the first electrode layer 11 and the second electrode layer 12 are inserted into the ceramic dielectric substrate 10. For example, the first electrode layer 11 and the second electrode layer 12 may be built into the ceramic dielectric substrate 10 by sintering as a continuous body.

The first electrode layer 11 is positioned between the first major surface 10a and the second major surface 10b in the Z-axis direction. The second electrode layer 12 is positioned between the first major surface 10a and the first electrode layer 11 in the Z-axis direction. In other words, the first electrode layer 11 is positioned between the second electrode layer 12 and the second major surface 10b in the Z-axis direction.

Figure 5:
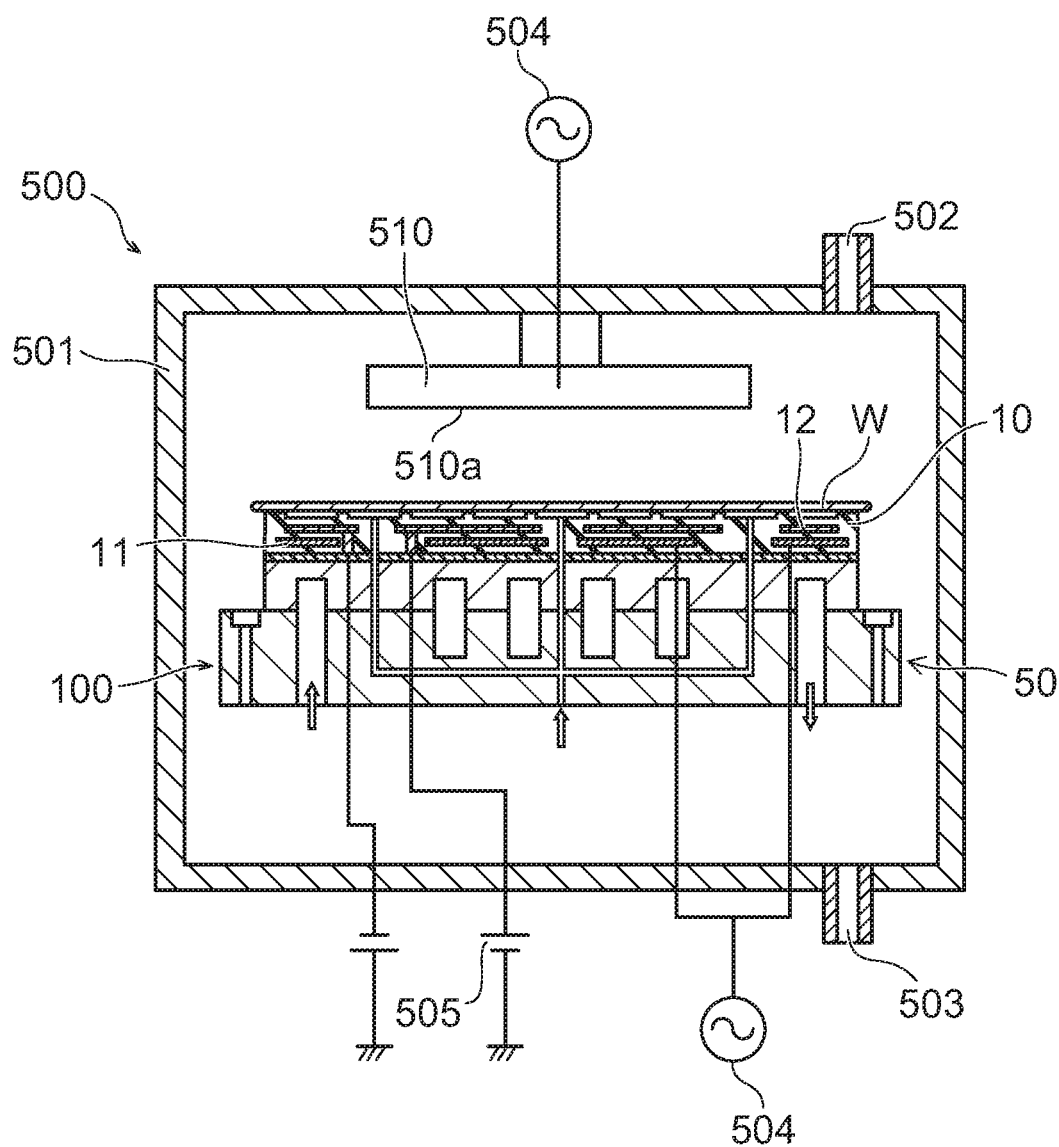
FIG. 5 is a cross-sectional view schematically illustrating a wafer processing apparatus including the electrostatic chuck according to the embodiment.

The first electrode layer 11 is connected to a high frequency power supply (a high frequency power supply 504 of FIG. 5). Plasma is generated inside a processing container (a processing container 501 of FIG. 5) by applying the voltage (the high frequency voltage) from the high frequency power supply to the first electrode layer 11 and the upper electrode (an upper electrode 510 of FIG. 5). In other words, the first electrode layer 11 is a lower electrode for generating the plasma. The high frequency power supply supplies a high frequency AC (alternating current) current to the first electrode layer 11. Here, "high frequency" is, for example, 200 kHz or more. The first electrode layer 11 has a first surface 11a at the first major surface 10a side, and a second surface 11b at the side opposite to the first surface 11a. The high frequency current is supplied to the first electrode layer 11 at the second surface 11b side.

The second electrode layer 12 is connected to a chucking power supply (a chucking power supply 505 of FIG. 5). The electrostatic chuck 100 attracts and holds the object W by an electrostatic force by generating a charge at the first major surface 10a side of the second electrode layer 12 by applying a voltage (a chucking voltage) to the second electrode layer 12 from the chucking power supply. In other words, the second electrode layer 12 is a chucking electrode for chucking the object W. The chucking power supply supplies a direct current (DC) or an AC current to the second electrode layer 12. The chucking power supply is, for example, a DC power supply. The chucking power supply may be, for example, an AC power supply.

The second electrode layer 12 is provided as necessary and is omissible. In the case where the second electrode layer 12 is omitted, the first electrode layer 11 is connected to the chucking power supply (the chucking power supply 505 of FIG. 5). In other words, in such a case, the first electrode layer 11 functions as the lower electrode for generating the plasma and the chucking electrode for chucking the object W.

The dimension in the Z-axis direction of the first electrode layer 11 is larger than the dimension in the Z-axis direction of the second electrode layer 12. In other words, for example, the thickness of the first electrode layer 11 is greater than the thickness of the second electrode layer 12. By setting the thickness of the first electrode layer 11 to be greater than the thickness of the second electrode layer 12, the effects of the skin effect can be reduced; and the in-plane uniformity of the plasma density can be increased. Methods for measuring the thicknesses of the first electrode layer 11 and the second electrode layer 12 are described below.

Thus, by providing the first electrode layer 11 inside the ceramic dielectric substrate 10, the distance between the first electrode layer 11 (the lower electrode) and the upper electrode (the upper electrode 510 of FIG. 5) of the high frequency power supply provided higher than the electrostatic chuck 100 can be shortened. Thereby, for example, compared to the case where the base plate 50 is used as the lower electrode, etc., the plasma density can be increased using low electrical power. In other words, the electrical power that is necessary to obtain a high plasma density can be reduced.

The first electrode layer 11 and the second electrode layer 12 have thin-film configurations along the first major surface 10a and the second major surface 10b of the ceramic dielectric substrate 10.

The first electrode layer 11 includes a ceramic component and a metal component. For example, it is favorable for the first electrode layer 11 to be made of a ceramic component and a metal component.

The ceramic component of the first electrode layer 11 includes, for example, at least one of aluminum oxide, aluminum nitride, silicon carbide, silicon nitride, or yttria oxide (yttria ($Y_2O_3$)).

The ceramic component of the first electrode layer 11 is, for example, the same as a major component of the ceramic dielectric substrate 10. By setting the ceramic component of the first electrode layer 11 to be the same as a major component of the ceramic dielectric substrate 10, the difference between the thermal expansion coefficient of the ceramic dielectric substrate 10 and the thermal expansion coefficient of the first electrode layer 11 can be reduced; and discrepancies such as peeling between the ceramic dielectric substrate 10 and the first electrode layer 11, etc., can be suppressed.

The metal component in the first electrode layer 11 includes, for example, at least one of palladium (Pd), silver (Ag), platinum (Pt), molybdenum (Mo), or tungsten (W).

The second electrode layer 12 includes a metal component. The second electrode layer 12 may include a ceramic component and a metal component. It is favorable for the second electrode layer 12 to be made of a ceramic component and a metal component.

The ceramic component of the second electrode layer 12 includes, for example, at least one of aluminum oxide, aluminum nitride, silicon carbide, silicon nitride, or yttrium oxide. For example, the ceramic component of the second electrode layer 12 is the same as a major component of the ceramic dielectric substrate 10. For example, the ceramic component of the second electrode layer 12 is the same as the ceramic component of the first electrode layer 11.

The metal component in the second electrode layer 12 includes, for example, at least one of palladium (Pd), silver (Ag), platinum (Pt), molybdenum (Mo), or tungsten (W). For example, the metal component in the second electrode layer 12 is the same as the metal component in the first electrode layer 11.

A connection portion 20 that extends to the second major surface 10b side of the ceramic dielectric substrate 10 is provided at the second electrode layer 12. The connection portion 20 is, for example, a via (solid) or a via hole (hollow) that is electrically connected to the second electrode layer 12. The connection portion 20 may be a metal terminal connected by an appropriate method such as brazing, etc.

The base plate 50 is a member supporting the ceramic dielectric substrate 10. The ceramic dielectric substrate 10 is fixed on the base plate 50 by a bonding member 60. For example, a silicone bonding agent is used as the bonding member 60.

For example, the base plate 50 is made of a metal such as aluminum, etc. For example, the base plate 50 may be made of a ceramic. For example, the base plate 50 is divided into an upper portion 50a and a lower portion 50b; and a passageway 55 is provided between the upper portion 50a and the lower portion 50b. One end of the passageway 55 is connected to an input channel 51; and the other end of the passageway 55 is connected to an output channel 52.

The base plate 50 also performs the role of the temperature adjustment of the electrostatic chuck 100. For example, when cooling the electrostatic chuck 100, a cooling medium such as helium gas or the like is caused to inflow through the input channel 51, pass through the passageway 55, and outflow from the output channel 52. Thereby, the heat of the base plate 50 can be absorbed by the cooling medium; and the ceramic dielectric substrate 10 that is mounted on the base plate 50 can be cooled. On the other hand, when maintaining the temperature of the electrostatic chuck 100, it is also possible to introduce a heat-retaining medium into the passageway 55. It is also possible to provide a built-in heating element in the ceramic dielectric substrate 10 and/or the base plate 50. The temperature of the object W held by the electrostatic chuck 100 can be adjusted by adjusting the temperature of the base plate 50 and/or the ceramic dielectric substrate 10.

In the example, a channel 14 is provided at the first major surface 10a side of the ceramic dielectric substrate 10. The channel 14 is recessed in the direction from the first major surface 10a toward the second major surface 10b (the Z-axis direction) and extends to be continuous in the X-Y plane.

Multiple protrusions 13 (dots) are provided in at least a portion of the region of the first major surface 10a where the channel 14 is not provided. The object W is placed on the multiple protrusions 13 and is supported by the multiple protrusions 13. The protrusion 13 is a surface contacting the back surface of the object W. If the multiple protrusions 13 are provided, a space is formed between the first major surface 10a and the back surface of the object W placed on the electrostatic chuck 100. For example, the particles that are adhered to the object W can be caused to be in a favorable state by appropriately selecting the height and the number of the protrusions 13, the area ratio and the shapes of the protrusions 13, etc. For example, the height (the dimension in the Z-axis direction) of the multiple protrusions 13 can be not less than 1 µm and not more than 100 µm, and favorably not less than 1 µm and not more than 30 µm, and more favorably not less than 5 µm and not more than 15 µm.

The ceramic dielectric substrate 10 has a through-hole 15 connected to the channel 14. The through-hole 15 is provided from the second major surface 10b to the first major surface 10a. In other words, the through-hole 15 extends in the Z-axis direction from the second major surface 10b to the first major surface 10a and pierces the ceramic dielectric substrate 10.

A gas introduction channel 53 is provided in the base plate 50. For example, the gas introduction channel 53 is provided to pierce the base plate 50. The gas introduction channel 53 may not pierce through the base plate 50, and may be provided to reach the ceramic dielectric substrate 10 side by branching partway into other gas introduction channels 53. The gas introduction channel 53 may be provided in multiple locations of the base plate 50.

The gas introduction channel 53 communicates with the through-hole 15. In other words, the transfer gas (helium (He) or the like) that inflows into the gas introduction channel 53 inflows into the through-hole 15 after passing through the gas introduction channel 53.

The transfer gas that inflows into the through-hole 15 inflows into the space provided between the object W and the channel 14 after passing through the through-hole 15. Thereby, the object W can be directly cooled by the transfer gas.

Figure 2:
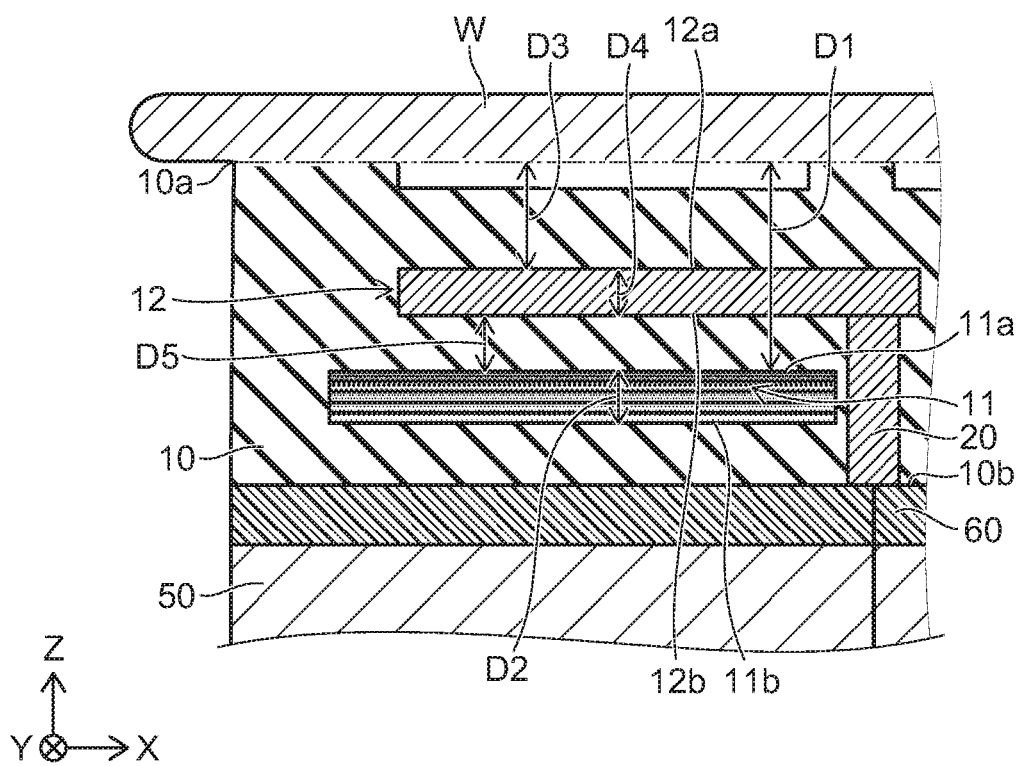
FIG. 2 is a cross-sectional view schematically illustrating an enlargement of a portion of the electrostatic chuck according to the embodiment.

FIG. 2 is a cross-sectional view schematically illustrating an enlargement of a portion of the electrostatic chuck according to the embodiment.

FIG. 2 shows an enlargement of a region R1 shown in FIG. 1.

As illustrated in FIG. 2, the first electrode layer 11 has the first surface 11a and the second surface 11b. The first surface 11a is a surface on the first major surface 10a side. The second surface 11b is a surface on the side opposite to the first surface 11a. In other words, the first surface 11a is the surface opposing the second electrode layer 12. For example, the second surface 11b is a surface parallel to the first surface 11a.

The first surface 11a is, for example, a surface parallel to the first major surface 10a. For example, a distance D1 along the Z-axis direction between the first surface 11a and the first major surface 10a is constant. In other words, the distance D1 is the distance from the first major surface 10a to the upper surface (the first surface 11a) of the first electrode layer 11. Here, "constant" may include, for example, the waviness of the first surface 11a, etc. For example, it is sufficient for the distance D1 to be substantially constant when the cross section of the electrostatic chuck 100 is observed by a scanning electron microscope (SEM), etc., at low magnification (e.g., about 100 times). The distance D1 is, for example, about 300 µm.

Thus, the distance between the upper electrode (the upper electrode 510 of FIG. 5) and the first electrode layer 11 (the lower electrode) can be constant by setting the distance D1 along the Z-axis direction between the first surface 11a and the first major surface 10a to be constant. Thereby, for example, the in-plane uniformity of the plasma density can be increased compared to the case where the distance D1 along the Z-axis direction between the first surface 11a and the first major surface 10a is not constant, etc.

The thickness of the first electrode layer 11 is, for example, not less than 1 µm and not more than 500 µm, and favorably not less than 10 µm and not more than 100 µm. In other words, the thickness of the first electrode layer 11 is a distance D2 along the Z-axis direction between the first surface 11a and the second surface 11b. By setting the thickness (the distance D2) of the first electrode layer 11 to be in this range, the effects of the skin effect can be reduced; and the in-plane uniformity of the plasma density can be increased. For example, the thickness (the distance D2) of the first electrode layer 11 can be determined as the average value of the thicknesses at the three points in a cross section SEM image of the first electrode layer 11. In this specification, the distance D2 is defined as the average value.

As illustrated in FIG. 2, the second electrode layer 12 has a third surface 12a on the first major surface 10a side, and a fourth surface 12b on the side opposite to the third surface 12a. In other words, the fourth surface 12b is the surface opposing the first electrode layer 11. The third surface 12a is, for example, a surface parallel to the fourth surface 12b.

The third surface 12a is, for example, a surface parallel to the first major surface 10a. For example, a distance D3 along the Z-axis direction between the third surface 12a and the first major surface 10a is constant. In other words, the distance D3 is the distance from the first major surface 10a to the upper surface (the third surface 12a) of the second electrode layer 12.

The thickness of the second electrode layer 12 is, for example, constant. In other words, the thickness of the second electrode layer 12 is a distance D4 along the Z-axis direction between the third surface 12a and the fourth surface 12b. For example, the thickness (the distance D4) of the second electrode layer 12 can be determined as the average value of the thicknesses at the three points in a cross section SEM image of the second electrode layer 12.

The thickness of the first electrode layer 11 is, for example, greater than the thickness of the second electrode layer 12. By setting the thickness of the first electrode layer 11 to be greater than the thickness of the second electrode layer 12, the effects of the skin effect can be reduced; and the in-plane uniformity of the plasma density can be increased.

FIG. 3A to FIG. 3D are cross-sectional views schematically illustrating a portion of the first electrode layer of the electrostatic chuck according to the embodiment.

As illustrated in FIG. 3A to FIG. 3D, the first electrode layer 11 includes, for example, first to fifth portions 111 to 115.

The first portion 111 includes the first surface 11a. The first portion 111 is, for example, the upper end portion of the first electrode layer 11. The second portion 112 is adjacent to the first portion 111 in the Z-axis direction. The second portion 112 is, for example, a portion positioned under the upper end portion (the first portion 111) of the first electrode layer 11.

The third portion 113 includes the second surface 11b. The third portion 113 is, for example, the lower end portion of the first electrode layer 11. The fourth portion 114 is adjacent to the third portion 113 in the Z-axis direction. The fourth portion 114 is, for example, a portion positioned on the lower end portion (the third portion 113) of the first electrode layer 11.

The fifth portion 115 is a portion positioned between the second portion 112 and the fourth portion 114 in the Z-axis direction. The fifth portion 115 is, for example, a portion adjacent to the second portion 112 and the fourth portion 114 in the Z-axis direction. The fifth portion 115 is provided as necessary and is omissible. In other words, the second portion 112 and the fourth portion 114 may be adjacent to each other in the Z-axis direction.

Figure 3A:
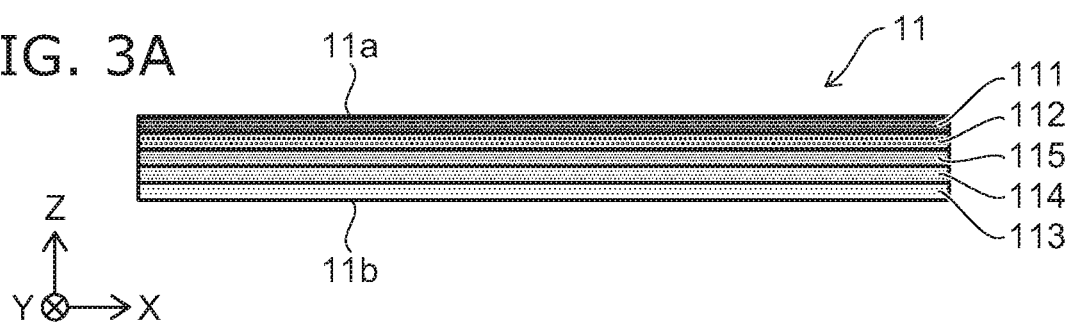
FIG. 3A to FIG. 3D are cross-sectional views schematically illustrating a portion of the first electrode layer of the electrostatic chuck according to the embodiment.
Figure 3B:
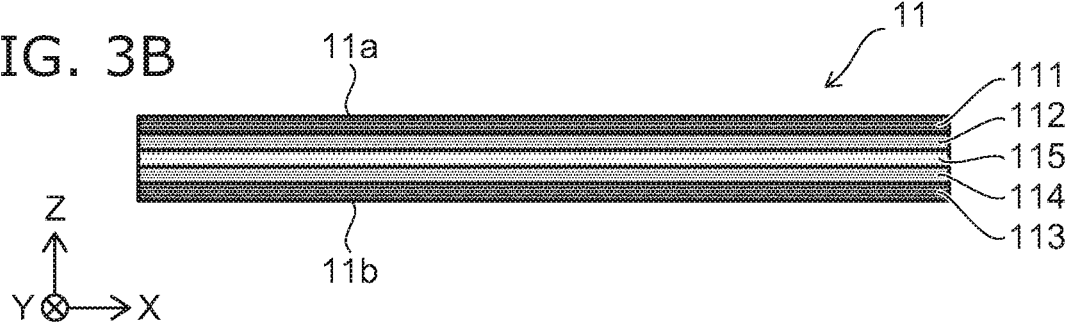
Figure 3C:
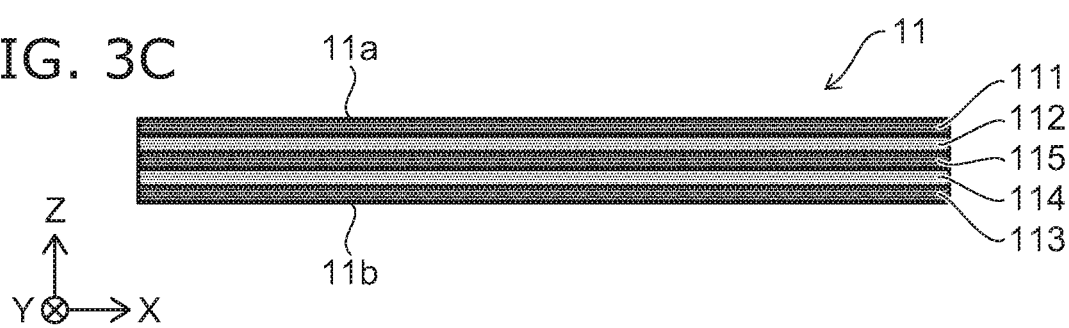
Figure 3D:
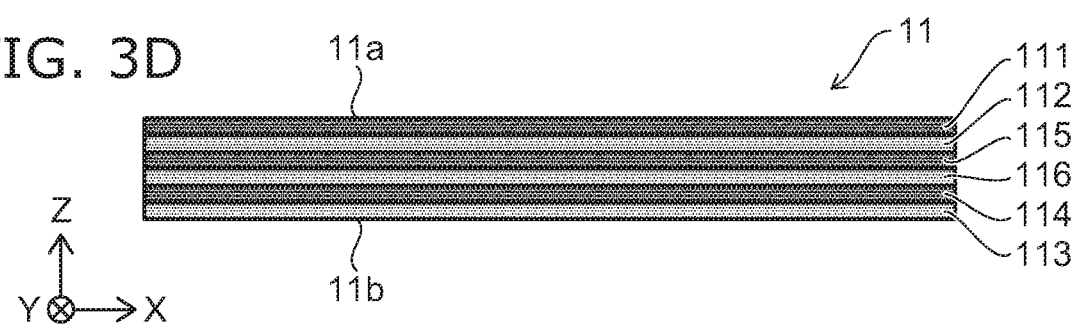

As shown in FIG. 3D, the first electrode layer 11 may further include a sixth portion 116 between the fifth portion 115 and the fourth portion 114.

Examples in which the first electrode layer 11 includes five layers (the first to fifth portions 111 to 115) are shown in FIG. 3A to FIG. 3C; and an example in which the first electrode layer 11 includes six layers is shown in FIG. 3D. In the embodiment, it is sufficient for the first electrode layer 11 to include two or more layers; for example, the first electrode layer 11 may include three layers (the first to third portions 111 to 113), four layers (the first to fourth portions 111 to 114), or seven or more layers. In the case of two layers, the second portion 112 includes the second surface 11b. In the case of three layers, the second portion 112 is adjacent to both the first portion 111 and the third portion 113; and the third portion 113 includes the second surface 11b.

As illustrated in FIG. 3A to FIG. 3C, the first electrode layer 11 in which the first portion 111, the second portion 112, the fifth portion 115, the fourth portion 114, and the third portion 113 are arranged in order from the first surface 11a toward the second surface 11b will now be described as an example.

In FIG. 3A to FIG. 3C, the concentration of the ceramic component and the concentration of the metal component are illustrated by the shading of the colors. More specifically, darker colors show that the concentration of the ceramic component is lower (the concentration of the metal component is higher); and lighter colors show that the concentration of the ceramic component is higher (the concentration of the metal component is lower).

In the embodiment, the concentration of the metal component in the first portion 111 is higher than the average concentration of the metal component in the first electrode layer 11.

Although the high frequency current propagates along the surface of the first electrode layer 11 due to the skin effect, if the skin effect of the first surface 11a of the first portion 111 is weak, the high frequency current that is supplied to the second surface 11b which is the surface of the first electrode layer 11 on the second major surface 10b side cannot flow to the center of the first surface 11a which is the surface of the first electrode layer 11 on the first major surface 10a side; and there are cases where the plasma density at the center vicinity of the first electrode layer 11 is not as expected.

Conversely, by setting the concentration of the metal component in the first portion 111 to be higher than the average concentration of the metal component in the first electrode layer 11, the electrical resistance of the first surface 11a of the first portion 111 can be smaller than the average electrical resistance of the first electrode layer 11. Thereby, the skin effect of the first surface 11a can be promoted; and the high frequency current that is supplied to the second surface 11b of the first electrode layer 11 can flow to the center of the first surface 11a. Accordingly, the plasma controllability can be increased; and the in-plane uniformity of the plasma density in the first electrode layer 11 can be increased.

It is also favorable for the concentration of the metal component in the first portion 111 to be set to be higher than the average concentration of the metal component in the second electrode layer 12. The resistance of the first electrode layer 11 to which the high frequency power is supplied can be reduced sufficiently thereby.

As shown in FIG. 3A, for example, the concentration of the metal component in the first portion 111 is higher than the concentration of the metal component in the portion of the first electrode layer 11 other than the first portion 111.

In the example shown in FIG. 3A, the concentration of the metal component in the first portion 111 is higher than the concentration of the metal component in the second portion 112 adjacent to the first portion 111. The concentration of the metal component in the third portion 113 is lower than the concentration of the metal component in the fourth portion 114. In the example, the fifth portion 115 is further included; and the concentration of the metal component in the fifth portion 115 is lower than the concentration of the metal component in the second portion 112 and higher than the concentration of the metal component in the fourth portion 114. That is, in the example, the concentration of the metal component decreases from the first portion 111 toward the third portion 113.

In the example shown in FIG. 3B, the concentration of the metal component in the first portion 111 is higher than the concentration of the metal component in the second portion 112. The concentration of the metal component in the third portion 113 is higher than the concentration of the metal component in the fourth portion 114. In the example, the fifth portion 115 is further included; and the concentration of the metal component in the fifth portion 115 is lower than the concentration of the metal component in the second portion 112 and lower than the concentration of the metal component in the fourth portion 114. That is, in the example, the concentration of the metal component decreases from the first portion 111 toward the fifth portion 115; and the concentration of the metal component increases from the fifth portion 115 toward the third portion 113.

In the example, the concentration of the metal component in the first portion 111 is the same as the concentration of the metal component in the third portion 113; but the concentration of the metal component in the first portion 111 may be higher than the concentration of the metal component in the third portion 113 or lower than the concentration of the metal component in the third portion 113. In the example, the concentration of the metal component in the second portion 112 is the same as the concentration of the metal component in the fourth portion 114; but the concentration of the metal component in the second portion 112 may be higher than the concentration of the metal component in the fourth portion 114 or lower than the concentration of the metal component in the fourth portion 114.

In the example shown in FIG. 3C, the concentration of the metal component in the first portion 111 is higher than the concentration of the metal component in the second portion 112. The concentration of the metal component in the third portion 113 is higher than the concentration of the metal component in the fourth portion 114. In the example, the fifth portion 115 is further included; and the concentration of the metal component in the fifth portion 115 is higher than the concentration of the metal component in the second portion 112 and higher than the concentration of the metal component in the fourth portion 114. In the example, portions (the first portion 111, the third portion 113, and the fifth portion 115) having concentrations of the metal component higher than the concentrations of the metal component in the adjacent portions and portions (the second portion 112 and the fourth portion 114) having concentrations of the metal component lower than the concentrations of the metal component in adjacent portions are provided alternately.

In the example, the concentration of the metal component in the first portion 111 is the same as the concentrations of the metal component in the third portion 113 and the fifth portion 115; but the concentration of the metal component in the first portion 111 may be higher than the concentration of the metal component in the third portion 113 or lower than the concentration of the metal component in the third portion 113. The concentration of the metal component in the first portion 111 may be higher than the concentration of the metal component in the fifth portion 115 or lower than the concentration of the metal component in the fifth portion 115. The concentration of the metal component in the third portion 113 may be higher than the concentration of the metal component in the fifth portion 115 or lower than the concentration of the metal component in the fifth portion 115. In the example, the concentration of the metal component in the second portion 112 is the same as the concentration of the metal component in the fourth portion 114; but the concentration of the metal component in the second portion 112 may be higher than the concentration of the metal component in the fourth portion 114 or lower than the concentration of the metal component in the fourth portion 114.

In the example shown in FIG. 3D, the concentration of the metal component in the first portion 111 is higher than the concentration of the metal component in the second portion 112. The concentration of the metal component in the third portion 113 is lower than the concentration of the metal component in the fourth portion 114. In the example, the fifth portion 115 and the sixth portion 116 are further included; and the concentration of the metal component in the fifth portion 115 is higher than the concentration of the metal component in the second portion 112 and higher than the concentration of the metal component in the sixth portion 116. The concentration of the metal component in the sixth portion 116 is lower than the concentration of the metal component in the fourth portion 114. That is, in the example, portions (the first portion 111, the fourth portion 114, and the fifth portion 115) having concentrations of the metal component higher than the concentrations of the metal component in the adjacent portions and portions (the second portion 112, the third portion 113, and the sixth portion 116) having concentrations of the metal component lower than the concentrations of the metal component in the adjacent portions are provided alternately.

In the example, the concentration of the metal component in the first portion 111 is the same as the concentrations of the metal component in the fourth portion 114 and the fifth portion 115; but the concentration of the metal component in the first portion 111 may be higher than the concentration of the metal component in the fourth portion 114 or lower than the concentration of the metal component in the fourth portion 114. The concentration of the metal component in the first portion 111 may be higher than the concentration of the metal component in the fifth portion 115 or lower than the concentration of the metal component in the fifth portion 115. The concentration of the metal component in the fourth portion 114 may be higher than the concentration of the metal component in the fifth portion 115 or lower than the concentration of the metal component in the fifth portion 115. In the example, the concentration of the metal component in the second portion 112 is the same as the concentrations of the metal component in the third portion 113 and the sixth portion 116; but the concentration of the metal component in the second portion 112 may be higher than the concentration of the metal component in the third portion 113 or lower than the concentration of the metal component in the third portion 113. The concentration of the metal component in the second portion 112 may be higher than the concentration of the metal component in the sixth portion 116 or lower than the concentration of the metal component in the sixth portion 116. The concentration of the metal component in the third portion 113 may be higher than the concentration of the metal component in the sixth portion 116 or lower than the concentration of the metal component in the sixth portion 116.

As illustrated in FIG. 3A to FIG. 3D, by setting the concentration of the metal component in the first portion 111 to be higher than the concentration of the metal component in the second portion 112, the electrical resistance of the first surface 11a of the first portion 111 can be smaller than the electrical resistance of the second portion 112. Thereby, the skin effect of the first surface 11a can be promoted; and the high frequency current that is supplied to the second surface 11b of the first electrode layer 11 can flow to the center of the first surface 11a. Accordingly, the plasma controllability can be increased; and the in-plane uniformity of the plasma density in the first electrode layer 11 can be increased.

As illustrated in FIG. 3A, by setting the concentration of the metal component in the first portion 111 to be higher than the concentration of the metal component in the portions (e.g., the second to fifth portions 112 to 115) other than the first portion 111, the electrical resistance of the first surface 11a of the first portion 111 can be smaller than the electrical resistance of the portions other than the first portion 111. Thereby, the skin effect of the first surface 11a can be promoted; and the high frequency current that is supplied to the second surface 11b of the first electrode layer 11 can flow to the center of the first surface 11a. Accordingly, the plasma controllability can be increased; and the in-plane uniformity of the plasma density in the first electrode layer 11 can be increased.

As illustrated in FIG. 3B and FIG. 3C, by setting the concentration of the metal component in the third portion 113 to be higher than the average concentration of the metal component in the first electrode layer 11, the surfaces of both the second surface 11b side and the first surface 11a side of the first electrode layer 11 where the high frequency power is supplied and a high frequency current is considered to flow due to the skin effect can have a low resistance. The plasma controllability can be improved thereby.

It is favorable for the thermal conductivity of the metal component included in the first electrode layer 11 to be larger than the thermal conductivity of the ceramic component included in the first electrode layer 11 in the case where the concentration of the metal component in the third portion 113 is higher than the average concentration of the metal component in the first electrode layer 11.

Thus, by setting the thermal conductivity of the metal component included in the first electrode layer 11 to be larger than the thermal conductivity of the ceramic component included in the first electrode layer 11 and setting the concentration of the metal component in the third portion 113 positioned at the base plate 50 side to be higher than the average concentration of the metal component in the first electrode layer 11, the heat that is generated when the high frequency power is applied can be dissipated efficiently to the base plate 50 side; and the unfavorable effects on the in-plane uniformity of the plasma density due to the heat generation can be suppressed.

As illustrated in FIG. 3B and FIG. 3C, by setting the concentration of the metal component in the third portion 113 to be higher than the concentration of the metal component in the fourth portion 114, the surfaces of both the second surface 11b side and the first surface 11a side of the first electrode layer 11 where the high frequency power is supplied and a high frequency current is considered to flow due to the skin effect can have a low resistance. The plasma controllability can be improved thereby.

It is also favorable for the concentration of the metal component in the third portion 113 to be set to be higher than the average concentration of the metal component in the second electrode layer 12. The resistance of the first electrode layer 11 to which the high frequency power is supplied can be reduced sufficiently thereby.

On the other hand, as illustrated in FIG. 3A and FIG. 3D, by setting the concentration of the metal component in the third portion 113 to be lower than the concentration of the metal component in the fourth portion 114, the difference between the thermal expansion coefficient of the ceramic dielectric substrate 10 and the thermal expansion coefficient of the first electrode layer 11 can be reduced; and discrepancies such as peeling between the ceramic dielectric substrate 10 and the first electrode layer 11, etc., can be suppressed even for the first electrode layer 11 which is thicker than the second electrode layer 12.

As illustrated in FIG. 3B, by setting the concentration of the metal component in the fifth portion 115 to be lower than the concentrations of the metal component in the second portion 112 and the fourth portion 114, the stress of the entire first electrode layer 11 can be relaxed.

The concentrations of the ceramic component and the concentrations of the metal component are nonuniform in the Z-axis direction for each of the first to fifth portions 111 to 115. For example, the concentrations of the ceramic component and the concentrations of the metal component may change continuously in the Z-axis direction for each of the first to fifth portions 111 to 115.

The concentration of the ceramic component in the first portion 111 is, for example, not more than 70%, and favorably not less than 1% and not more than 70%, and more favorably not less than 20% and not more than 60%.

The concentration of the metal component in the first portion 111 is, for example, not less than 30%, and favorably not less than 30% and not more than 99%, and more favorably not less than 40% and not more than 80%. Thus, by setting the concentration of the metal component in the first portion 111 to be not less than 30%, the resistance value of the first portion 111 can be a value more favorable for the lower electrode for plasma generation.

In the embodiment, the concentration of the ceramic component and the concentration of the metal component can be determined by observing the cross section of each portion of the first electrode layer 11 by SEM-EDX (Energy Dispersive X-ray Spectroscopy) and by performing image analysis. More specifically, the concentration of the ceramic component and the concentration of the metal component can be calculated by acquiring a cross section SEM-EDX image of each portion of the first electrode layer 11, classifying the image into the ceramic component and the metal component by EDX component analysis, and by performing image analysis to determine the area ratio of the ceramic component and the metal component.

The average concentration of the ceramic component in the first electrode layer 11 can be calculated as the average value of the ceramic concentrations of the portions (the first to sixth portions 111 to 116) determined by the method recited above. The average concentration of the metal component in the first electrode layer 11 can be calculated as the average value of the metal concentrations of the portions (the first to sixth portions 111 to 116) determined by the method recited above.

According to the embodiment, the in-plane uniformity of the plasma density can be increased by adjusting at least one of the concentration of the ceramic component or the concentration of the metal component in the first electrode layer 11. The resistance value (the insulative properties) and the thermal expansion coefficient of the first electrode layer 11, the heat generation, the heat dissipation, and the thermal uniformity of the first electrode layer 11 when the voltage is applied from the high frequency power supply 504, etc., can be optimized.

Figure 4A:
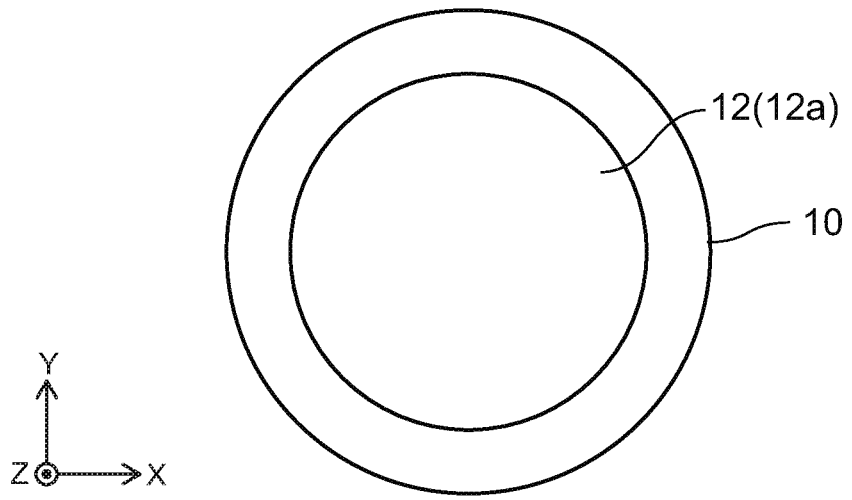
FIG. 4A and FIG. 4B are plan views schematically illustrating a portion of the electrostatic chuck according to the embodiment.
Figure 4B:
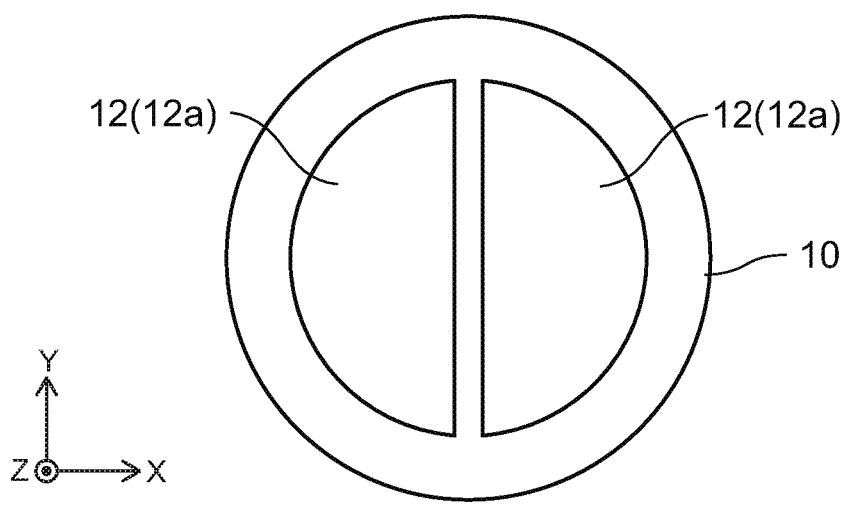

FIG. 4A and FIG. 4B are plan views schematically illustrating a portion of the electrostatic chuck according to the embodiment.

These drawings are plan views viewing the second electrode layer 12 from the third surface 12a side (the upper side) in a state in which the portion of the electrostatic chuck 100 positioned at the first major surface 10a side (the upper side) of the second electrode layer 12 (the third surface 12a) of the ceramic dielectric substrate 10 is not illustrated.

As illustrated in FIG. 4A and FIG. 4B, the second electrode layer 12 may be unipolar or bipolar. In the case where the second electrode layer 12 is unipolar, one second electrode layer 12 that spreads along the X-Y plane is provided as illustrated in FIG. 4A. The second electrode layer 12 is, for example, substantially circular when viewed along the Z-axis direction. On the other hand, in the case where the second electrode layer 12 is bipolar, two second electrode layers 12 that spread along the X-Y plane and are positioned in the same plane are provided as illustrated in FIG. 4B. The second electrode layers 12 each are, for example, substantially semicircular when viewed along the Z-axis direction. For example, the second electrode layer 12 may have a pattern spreading along the X-Y plane.

For example, a portion of the first electrode layer 11 does not overlap the second electrode layer 12 in the Z-axis direction. The total of the surface area of the first surface 11a (the surface on the first major surface 10a side) of the first electrode layer 11 is, for example, larger than the total of the surface area of the third surface 12a (the surface on the first major surface 10a side) of the second electrode layer 12. In other words, when viewed along the Z-axis direction, the total of the surface area of the first electrode layer 11 is larger than the total of the surface area of the second electrode layer 12. The in-plane uniformity of the plasma density can be increased further thereby.

A method for making the ceramic dielectric substrate 10 inside which the first electrode layer 11 and the second electrode layer 12 are provided will now be described.

For example, the ceramic dielectric substrate 10 inside which the first electrode layer 11 and the second electrode layer 12 are provided can be made by stacking each layer in a state in which the first major surface 10a side is down and by sintering the stacked body. More specifically, for example, the second electrode layer 12 is stacked on a first layer which is a ceramic layer including the first major surface 10a. A second layer which is a ceramic layer between the first electrode layer 11 and the second electrode layer 12 is stacked on the second electrode layer 12. The first electrode layer 11 is stacked on the second layer. A third layer which is a ceramic layer including the second major surface 10b is stacked on the first electrode layer 11. Then, the stacked body is sintered.

For example, the first electrode layer 11 is formed by screen printing, paste coating (spin coating, a coater, inkjet, a dispenser, etc.), vapor deposition, etc. For example, the first electrode layer 11 can be formed by stacking the layers over multiple times in the state in which the first major surface 10a is down. At this time, for example, the concentration of the ceramic component and the concentration of the metal component can be adjusted in the Z-axis direction by changing the compositions of the stacked layers.

FIG. 5 is a cross-sectional view schematically illustrating a wafer processing apparatus including the electrostatic chuck according to the embodiment.

As illustrated in FIG. 5, the wafer processing apparatus 500 includes the processing container 501, the high frequency power supply 504, the chucking power supply 505, the upper electrode 510, and the electrostatic chuck 100. A processing gas inlet 502 for introducing a processing gas to the interior and the upper electrode 510 are provided at the ceiling of the processing container 501. An exhaust port 503 for evacuating the interior is provided at the bottom plate of the processing container 501. The electrostatic chuck 100 is disposed under the upper electrode 510 inside the processing container 501. The upper electrode 510 and the first electrode layer 11 of the electrostatic chuck 100 are connected to the high frequency power supply 504. The second electrode layer 12 of the electrostatic chuck 100 is connected to the chucking power supply 505.

The first electrode layer 11 and the upper electrode 510 are provided to be substantially parallel and separated from each other by a prescribed spacing. More specifically, the first surface 11a of the first electrode layer 11 is substantially parallel to a lower surface 510a of the upper electrode 510. Also, the first major surface 10a of the ceramic dielectric substrate 10 is substantially parallel to the lower surface 510a of the upper electrode 510. The object W is placed on the first major surface 10a positioned between the first electrode layer 11 and the upper electrode 510.

When a voltage (a high frequency voltage) is applied to the first electrode layer 11 and the upper electrode 510 from the high frequency power supply 504, high frequency electric discharge occurs; the processing gas that is introduced to the processing container 501 is excited by the plasma and activated; and the object W is processed.

When a voltage (a chucking voltage) is applied to the second electrode layer 12 from the chucking power supply 505, a charge is generated at the first major surface 10a side of the second electrode layer 12; and the object W is held to the electrostatic chuck 100 by an electrostatic force.

According to the embodiments as described above, an electrostatic chuck can be provided in which the in-plane uniformity of the plasma density can be increased.

Hereinabove, embodiments of the invention are described. However, the invention is not limited to these descriptions. Appropriate design modifications made by one skilled in the art for the embodiments described above also are within the scope of the invention to the extent that the features of the invention are included. For example, the configurations, the dimensions, the materials, the arrangements, and the like of the electrostatic chuck can be modified appropriately and are not limited to those illustrated.

Also, the components included in the embodiments described above can be combined within the limits of technical feasibility; and such combinations also are within the scope of the invention to the extent that the features of the invention are included.

What is claimed is:

1. An electrostatic chuck, comprising:
a ceramic dielectric substrate having a first major surface and a second major surface, the first major surface being where an object to be chucked is placed, the second major surface being at a side opposite to the first major surface;
a base plate supporting the ceramic dielectric substrate; and
at least one first electrode layer provided inside the ceramic dielectric substrate and connected to a high frequency power supply,
the first electrode layer being provided between the first major surface and the second major surface in a Z-axis direction, the Z-axis direction being from the base plate toward the ceramic dielectric substrate,
the first electrode layer having a first surface and a second surface and being supplied with the high frequency power supply at the second surface side, the first surface being at the first major surface side, the second surface being at a side opposite to the first surface,
the first electrode layer including a first portion and including a ceramic component and a metal component, the first portion including the first surface,
a concentration of the metal component in the first portion being higher than an average concentration of the metal component in the first electrode layer.

2. The chuck according to claim 1, further comprising at least one second electrode layer provided inside the ceramic dielectric substrate and connected to a chucking power supply, a dimension in the Z-axis direction of the first electrode layer being larger than a dimension in the Z-axis direction of the second electrode layer, the second electrode layer being provided between the first electrode layer and the first major surface in the Z-axis direction.

3. The chuck according to claim 2, wherein the concentration of the metal component in the first portion is higher than an average concentration of the metal component in the second electrode layer.

4. The chuck according to claim 2, wherein the first electrode layer further includes a third portion including the second surface, and a concentration of the metal component in the third portion is higher than an average concentration of the metal component in the second electrode layer.

5. The chuck according to claim 1, wherein the concentration of the metal component in the first portion is higher than a concentration of the metal component in a portion of the first electrode layer other than the first portion.

6. The chuck according to claim 1, wherein the first electrode layer further includes a second portion adjacent to the first portion in the Z-axis direction, and the concentration of the metal component in the first portion is higher than a concentration of the metal component in the second portion.

7. The chuck according to claim 1, wherein the first electrode layer further includes a third portion including the second surface, and a concentration of the metal component in the third portion is higher than the average concentration of the metal component in the first electrode layer.

8. The chuck according to claim 7, wherein a thermal conductivity of the metal component is larger than a thermal conductivity of the ceramic component.

9. The chuck according to claim 1, wherein the first electrode layer further includes a third portion and a fourth portion, the third portion including the second surface, the fourth portion being adjacent to the third portion in the Z-axis direction, and a concentration of the metal component in the third portion is higher than a concentration of the metal component in the fourth portion.

10. The chuck according to claim 1, wherein the concentration of the metal component in the first portion is 30% or more.

11. The chuck according to claim 1, wherein the ceramic component is the same as a major component of the ceramic dielectric substrate.

12. The chuck according to claim 1, wherein the ceramic component includes at least one of aluminum oxide, aluminum nitride, silicon carbide, silicon nitride, or yttrium oxide.

13. The chuck according to claim 1, wherein the metal component includes at least one of palladium, silver, platinum, molybdenum, or tungsten.

14. The chuck according to claim 1, wherein a thickness of the first electrode layer is not less than 1 μm and not more than 500 μm.

* * * * *